United States Patent
Song (10) Patent No.: US 7,795,050 B2
(45) Date of Patent: *Sep. 14, 2010

(54) SINGLE-CRYSTAL NITRIDE-BASED SEMICONDUCTOR SUBSTRATE AND METHOD OF MANUFACTURING HIGH-QUALITY NITRIDE-BASED LIGHT EMITTING DEVICE BY USING THE SAME

(75) Inventor: June O Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/416,414

(22) Filed: Apr. 1, 2009

(65) Prior Publication Data

US 2009/0191659 A1 Jul. 30, 2009

Related U.S. Application Data

(63) Continuation-in-part of application No. 11/503,720, filed on Aug. 14, 2006, now Pat. No. 7,521,269.

(30) Foreign Application Priority Data

Aug. 12, 2005 (KR) .................. 10-2005-0074100

(51) Int. Cl.
*H01L 21/00* (2006.01)
(52) U.S. Cl. .................. 438/22; 438/37; 438/47; 438/455; 257/103; 257/E33.002; 257/E33.025; 257/E21.104
(58) Field of Classification Search .............. 438/22, 438/37, 47, 455; 257/103, E33.002, E33.025, 257/E21.104
See application file for complete search history.

(56) References Cited

U.S. PATENT DOCUMENTS

| 6,233,265 | B1 | 5/2001 | Bour et al. |
| 6,495,867 | B1 | 12/2002 | Chen et al. |
| 7,221,001 | B2 | 5/2007 | Okuyama et al. |
| 7,521,269 | B2 * | 4/2009 | Song ............... 438/22 |
| 2005/0026394 | A1 * | 2/2005 | Letertre et al. ...... 438/459 |

FOREIGN PATENT DOCUMENTS

| JP | 2001168389 | 6/2001 |
| KR | 1020050058954 | 6/2005 |

* cited by examiner

*Primary Examiner*—Tu-Tu V Ho
(74) *Attorney, Agent, or Firm*—Cantor Colburn LLP (57) ABSTRACT

A nitride-based light emitting device is manufactured by using a single-crystal nitride-based semiconductor substrate. A seed material layer is deposited on a first substrate where organic residues including a natural oxide layer are removed from an upper surface of the first substrate. A multifunctional substrate is grown from the seed material layer. The single-crystal nitride-based semiconductor layer including a nitride-based buffer layer is formed on the multifunctional substrate. The seed material layer primarily assists the growth of the multifunctional substrate, which is essentially required for the growth of the single-crystal nitride-based semiconductor substrate. The multifunctional substrate is prepared in the form of a single-crystal layer or a poly-crystal layer having a hexagonal crystalline structure. The light emitting device employing the single-crystal nitride-based semiconductor substrate is used as a next-generation white light source having high capacity, large area, high brightness and high performance.

20 Claims, 9 Drawing Sheets

- Prepare substrate — 635
- Deposit seed material layer — 645
- Deposit alumina — 655
- Load into MOCVD — 665
- Grow single crystal nitride-based layer — 675
- Attach second supporting substrate — 685
- Wet etching or dry etching — 695
- Form reflective bonding p-ohmic contact layer — 705
- Attach third supporting substrate — 715
- Remove second supporting substrate — 725
- Form transparent n-ohmic contact layer — 735

Fig. 6B

SINGLE-CRYSTAL NITRIDE-BASED SEMICONDUCTOR SUBSTRATE AND METHOD OF MANUFACTURING HIGH-QUALITY NITRIDE-BASED LIGHT EMITTING DEVICE BY USING THE SAME

This application is a continuation-in-part of U.S. application Ser. No. 11/503,720, filed Aug. 14, 2006, which claims priority to Korean Patent Application No. 2005-74100, filed on Aug. 12, 2005, and all the benefits accruing therefrom under 35 U.S.C. §119, the contents of which in their entirety are herein incorporated by reference.

BACKGROUND OF THE INVENTION

1. Field of the Invention

The present invention relates to a single-crystal nitride-based semiconductor substrate and a method of manufacturing a vertical type nitride-based light emitting device by using the same. More particularly, the present invention relates to a method of growing a single-crystal nitride-based semiconductor substrate under high temperature and hydrogen atmosphere by using a seed material layer ("SML") and a multi-functional substrate ("MS"), which are sequentially formed on an upper surface of a first substrate ("FS") so as to prevent mechanical and thermal strain and decomposition from occurring at the upper surface of the first substrate including sapphire, silicon (Si), zinc oxide ("ZnO") or gallium arsenide ("GaAs"). The present invention also relates to a high-quality nitride-based light emitting device and a manufacturing method thereof, in which the nitride-based light emitting device employs a single-crystal nitride-based semiconductor substrate and a light emitting structure, so that the nitride-based light emitting device has a large size and represents superior light efficiency and heat dissipation while being operated at a low operational voltage.

2. Description of the Related Art

With the rapid technological advance of optoelectronic devices, such as blue/green diodes, (near) infrared light emitting diodes, laser diodes and optical sensors, single-crystal nitride-based semiconductors have become very important materials in optical industrial fields. In general, optoelectronic devices employing the single-crystal nitride-based semiconductors are grown from the upper surface of a thick insulating sapphire substrate or a conductive silicon carbide ("SiC") substrate under the hydrogen atmosphere where ammonium ("NH$_3$") and hydrogen ("H$_2$") carrier gas are provided in a high temperature condition of 1200° C. or more. However, since the insulating sapphire substrate or the conductive silicon carbide substrate is expensive as compared with a silicon substrate, the insulating sapphire substrate and the conductive silicon carbide substrate are inefficient for cost purposes. Since the nitride-based optoelectronic devices generate a large amount of heat during the operation thereof, the substrate must dissipate the heat generated from the nitride-based optoelectronic devices. However, if the nitride-based optoelectronic devices are formed on the upper surface of the insulating sapphire substrate having a thickness of 70 micron meters or more, the insulating sapphire substrate cannot easily dissipate the heat because the insulating sapphire substrate has inferior thermal conductivity. Therefore, the insulating sapphire substrate may not serve as a next-generation white light source.

Different from the thick insulating sapphire substrate and the silicon carbide substrate, a transparent conductive zinc oxide ("ZnO") substrate has a small difference in a lattice constant relative to the nitride-based semiconductor while representing superior electrical and thermal conductivities and higher light transmittance. In addition, the transparent ZnO substrate can be fabricated at an inexpensive cost. Therefore, the transparent ZnO substrate has been recently spotlighted as a next-generation substrate for the nitride-based light emitting devices. However, the surface of the transparent conductive zinc oxide ("ZnO") substrate becomes unstable under a high temperature of 600° C. or more and a high vacuum of 10$^{-3}$ torr or more, thus easily decomposing the materials of the transparent conductive zinc oxide (ZnO) substrate. In addition, reduction of the transparent conductive ZnO substrate is promoted in reducing ambient employment of ammonium ("NH$_3$") and hydrogen ("H$_2$"). For this reason, the single-crystal nitride-based semiconductor is rarely grown under the reducing ambient having a temperature of 800° C. or more.

Other conductive substrates, including silicon (Si), silicon germanium ("SiGe"), or gallium arsenide ("GaAs"), have been suggested. However, these conductive substrates also represent problems at a temperature of 500° C. or more due to the motion of the dislocation slip system provided in the conductive substrates, thereby causing strain to and decomposition of materials. In addition, since these conductive substrates represent large differences in lattice constant and thermal expansion coefficient relative to the nitride-based semiconductor, high-quality nitride-based layers may not be easily grown from the above conductive substrates.

A laser lift off ("LLO") method has been most recently spotlighted in the industrial field as a method of manufacturing a nitride-based light emitting device for a next-generation high-brightness white light source. According to the LLO method, a high-quality nitride-based semiconductor layer or a light emitting structure is grown from an upper surface of a sapphire substrate having inferior thermal and electrical conductivities, and then a strong energy laser beam is irradiated onto a rear surface of the sapphire substrate, thereby separating the nitride semiconductor layer and the light emitting structure from the sapphire substrate. A highly reliable nitride-based light emitting device representing high brightness and having a large size required for the next-generation white light source can be manufactured by using the LLO method. However, since a strong energy laser beam is applied to the sapphire substrate in order to separate the nitride-based semiconductor layer and the light emitting structure from the sapphire substrate, heat having a temperature of 900° C. or more is generated from the interfacial surface between the sapphire substrate and the nitride-based semiconductor layer/the light emitting structure, so that the nitride-based semiconductor layer may be damaged or deformed, lowering the product yield and causing difficulties during the manufacturing process.

BRIEF SUMMARY OF THE INVENTION

The present invention provides a method of manufacturing a vertical type nitride-based light emitting device. More particularly, the present invention provides a method of growing a single-crystal nitride-based semiconductor substrate under the high-temperature hydrogen atmosphere by using a seed material layer and a multifunctional substrate, which are sequentially formed on an upper surface of a first substrate so as to prevent the upper surface of the first substrate including sapphire, silicon (Si), zinc oxide (ZnO) or gallium arsenide (GaAs) from being subject to mechanical and thermal strain and decomposition. The present invention also provides a manufacturing method of a high-quality nitride-based light emitting device, in which the nitride-based light emitting device employs a single-crystal nitride-based semiconductor substrate and a light emitting structure, so that the nitride-based light emitting device has a large size and represents superior light efficiency and heat dissipation while being operated at a low operational voltage.

In one aspect of the present invention, a seed material layer is deposited on a first substrate where organic residues including a natural oxide layer are removed from an upper surface of the first substrate, and a multifunctional substrate is grown from the seed material layer. A single-crystal nitride-based semiconductor layer including a nitride-based buffer layer is formed on the multifunctional substrate. The seed material layer primarily assists the growth of the multifunctional substrate, which is essentially required for the growth of the single-crystal nitride-based semiconductor substrate as well as for the fabrication of the highly reliable nitride-based light emitting device employing the single-crystal nitride-based semiconductor layer and the light emitting structure. In addition, the seed material layer improves the product yield of the nitride-based light emitting devices. In order to prevent the seed material layer from being subjected to strain and decomposition under the high-temperature hydrogen atmosphere, the multifunctional substrate includes aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N"). In addition, the multifunctional substrate has a single crystal structure or a poly-crystal structure to grow the single-crystal nitride-based semiconductor layer having high quality. The single-crystal nitride-based semiconductor substrate and the light emitting device using the same can be used as a next-generation white light source having high capacity, large area, high brightness and high performance.

According to an exemplary embodiment of the present invention, the single-crystal nitride-based semiconductor layer formed on the multifunctional substrate including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") serves to provide high-quality nitride-based optoelectronic devices and high-quality nitride-based flip chip type light emitting devices. In particular, the nitride-based light emitting devices include a nitride-based light emitting structure, wherein the nitride-based light emitting structure comprises a nitride-based buffer layer, a poly-crystal layer or a single-crystal layer, an n-nitride-based cladding layer, a p-nitride-based cladding layer, and a nitride-based active layer. The nitride-based buffer layer is in the form of an amorphous layer. The poly-crystal layer or a single-crystal layer comprises of aluminum-indium-gallium-nitride (AlxInyGazN, wherein x, y and z are integers). The n-nitride-based cladding layer comprises of aluminum-indium-gallium-nitride (AlxInyGazN, wherein x, y and z are integers). The p-nitride-based cladding layer comprises aluminum-indium-gallium-nitride (AlxInyGazN, wherein x, y and z are integers). The nitride-based active layer formed between two nitride-based cladding layers comprises aluminum-indium-gallium-nitride (AlxInyGazN, wherein x, y and z are integers).

The multifunctional substrate, which is a primary element of the present invention, includes at least one selected from the group consisting of aluminum oxide ("Al—O"), aluminum nitride ("Al—N"), aluminum nitride oxide ("Al—N—O"), gallium nitride ("Ga—N"), boron nitride ("B—N"), silicon carbide ("Si—C") and silicon carbon nitride ("Si—C—N"). In addition, the multifunctional substrate has thermal stability and reduction-resistant characteristics under the reduction atmosphere where ammonium ("NH₃") and hydrogen ("H₂") carrier gas are provided in the high temperature condition of about 1100° C. or more. Further, the multifunctional substrate allows the single-crystal nitride-based layer to be grown with a low density of dislocation that exerts bad influence upon the electrical and electronic characteristics of the optoelectronic device.

More preferably, the multifunctional substrate including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") is prepared in the form of a single crystal layer or a poly-crystal layer having a hexagonal crystalline structure. However, the present invention is not limited to the above crystal structure.

In exemplary embodiments, at least one of silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chrome (Cr), and lanthanum (La) is added to the multifunctional substrate including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") in order to adjust crystallinity and electron concentration and to reduce, as much as possible, dislocation density in the single-crystal nitride-based semiconductor layer formed on the upper surface of the multifunctional substrate. In exemplary embodiments, the metal, metal oxide, or metallic nitride oxide added to the multifunctional substrate has a nano-phase such that the dislocation density in the single-crystal nitride-based semiconductor layer can be easily adjusted.

In exemplary embodiments, the amount of elements added to the multifunctional substrate is limited within a range between 0.1 weight percent to 49 weight percent.

In exemplary embodiments, the multifunctional substrate has a thickness of 20 micron meters or less.

In exemplary embodiments, the multifunctional substrate including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") is formed through high-temperature/low temperature chemical vapor deposition ("CVD") using chemical reaction and/or physical vapor deposition ("PVD"), wherein the CVD includes metal-organic chemical vapor deposition ("MOCVD") and plasma enhanced vapor deposition ("PECVD"), and the PVD includes thermal or E-beam evaporation, pulsed laser deposition, sputtering deposition employing gas ions, such as oxygen (O₂), nitrogen (N₂), or argon (Ar), and co-sputtering deposition using at least two sputtering guns.

More preferably, the multifunctional substrate is grown from the upper surface of the seed material layer, which is formed on the upper surface of the first substrate, within a temperature range between room temperature and about 1500° C.

In order to successively grow the multifunctional substrate having superior crystallinity, the seed material layer is primarily formed on the first substrate before the multifunctional substrate is formed on the first substrate.

The seed material layer is stacked on the upper surface of the first substrate and allows the multifunctional substrate to have superior crystallinity and the hexagonal crystalline structure.

In exemplary embodiments, the seed material layer includes metal, oxide, nitride, carbide, boride, oxynitride, carbonnitride, or silicide as described below. In addition, the seed material layer is prepared in the form of a single layer or a multi-layer and has a thickness of 10 microns or less.

Examples of the metal used for the seed material layer 110 include: at least one material of Ti, Si, W, Co, Ni, Mo, Sc, Mg, Ge, Cu, Be, Zr, Fe, Al, Cr, Nb, Re, Rh, Ru, Hf, Ir, Os, V, Pd, Y, Ta, Tc, La and rare-earth metals.

Examples of the oxide used for the seed material layer 110 include: at least one material of BeO, $CeO_2$, $Cr_2O_3$, $HfO_2$, $La_2O_3$, MgO, $Nb_2O_3$, $SiO_2$, $Ta_2O_5$, $ThO_2$, $TiO_2$, $Y_2O_3$, $ZrO_2$ and $ZrSiO_2$, Examples of the nitride used for the seed material layer 110 include: at least one material of AlN, GaN, InN, BN, $Be_3N_2$, $Cr_2N$, HfN, MoN, NbN, $Si_3N_4$, TaN, $Ta_2N$, $Th_2N_2$, TiN, $WN_2$, $W_2N$, VN and ZrN.

Examples of the carbide used for the seed material layer 110 include: at least one material of $B_4C$, $Cr_2$, HfC, $LaC_2$, $Mo_2C$, $Nb_2C$, SiC, $Ta_2C$, $ThC_2$, TiC, $W_2C$, WC, $V_2C$ and ZrC, Examples of the boride used for the seed material layer 110 include: at least one material of $AlB_2$, $BeB_2$, $CrB_2$, $HfB_2$, $LaB_2$, $MoB_2$, MoB, $NbB_4$, $SiB_6$, $TaB_2$, $ThB_4$, $TiB_2$, WB, $VB_2$ and $ZrB_2$.

Examples of the oxynitride used for the seed material layer 110 include at least one material of AlON and SiON.

Examples of the carbonnitride used for the seed material layer 110 include SiCN, Examples of the silicide used for the seed material layer 110 include: at least one material of $CrSi_2$, $Cr_2Si$, $HfSi_2$, $MoSi_2$, $NbSi_2$, $TaSi_2$, $Ta_5Si_3$, $ThSi_2$, $Ti_5Si_3$, $WSi_2$, $W_5Si_3$, $V_3Si$ and $ZrSi_2$.

In exemplary embodiments, the seed material layer is formed through high-temperature/low temperature chemical vapor deposition ("CVD") using chemical reaction and/or physical vapor deposition ("PVD"), wherein the CVD includes metal-organic chemical vapor deposition ("MOCVD") and plasma enhanced vapor deposition ("PECVD"), and the PVD includes thermal or E-beam evaporation, pulsed laser deposition, sputtering deposition employing gas ions, such as oxygen ($O_2$), nitrogen ($N_2$), or argon (Ar), and co-sputtering deposition using at least two sputtering guns.

More preferably, the seed material layer is deposited on the upper surface of the first substrate within a temperature range between room temperature and about 1500° C.

In another exemplary embodiment of the present invention, a method of growing the single-crystal nitride-based semiconductor substrate includes;

depositing a seed material layer on an upper surface of a first substrate including sapphire, silicon (Si), zinc oxide ("ZnO") or gallium arsenide ("GaAs");

growing a multifunctional substrate from an upper surface of the seed material layer;

heat-treating the seed material layer and the multifunctional substrate;

installing the multi-layer structure in metal-organic chemical vapor deposition ("MOCVD") equipment and forming a multi-layer on an upper surface of the multifunctional substrate, in which the multi-layer consists of a nitride-based buffer layer and a thick single-crystal nitride-based layer stacked on the nitride-based buffer layer;

removing the seed material layer and the first substrate by performing wet etching or dry etching with respect to the multi-layer structure including the single-crystal nitride-based layer formed on the multifunctional substrate; and performing a heat-treatment process in order to enhance crystallinity of the thin multifunction substrate and the single-crystal nitride-based layer obtained through the above process.

In exemplary embodiments, a ZnO-based layer may be formed on the upper surface of the first substrate before the seed material layer and the multifunction substrate are formed on the first substrate. The ZnO-based layer may be removed in the same step of removing the seed material layer and the first substrate.

In still another exemplary embodiment of the present invention, a method of manufacturing a nitride-based light emitting device by using a single-crystal nitride-based semiconductor substrate includes:

depositing a seed material layer on an upper surface of a first substrate including sapphire, silicon (Si), zinc oxide ("ZnO") or gallium arsenide ("GaAs");

growing a multifunctional substrate from an upper surface of the seed material layer;

heat-treating the seed material layer and the multifunctional substrate;

installing the multi-layer structure in metal-organic chemical vapor deposition ("MOCVD") equipment and forming a single-crystal nitride-based light emitting structure on an upper surface of the multifunctional substrate, in which a single-crystal nitride-based light emitting structure comprises a nitride-based buffer layer, an n-nitride-based cladding layer, a nitride-based active layer, and a p-nitride-based cladding layer, which are sequentially stacked on the upper surface of the multifunctional substrate;

removing the seed material layer and the first substrate by performing wet etching or dry etching with respect to the multi-layer structure including the single-crystal nitride-based layer formed on the multifunctional substrate;

performing a heat-treatment process in order to enhance crystallinity of the thin multifunction substrate and the single-crystal nitride-based layer obtained through the above process; and selectively depositing reflective electrode materials or transparent electrode materials on a single-crystal nitride-based light emitting structure having the thin multifunction substrate and then performing an ohmic heat-treatment process.

In exemplary embodiments, a ZnO-based layer may be formed on the upper surface of the first substrate before the seed material layer and the multifunction substrate are formed on the first substrate. The ZnO-based layer may be removed in the same step of removing the seed material layer and the first substrate.

BRIEF DESCRIPTION OF THE DRAWINGS

The above and other aspects, features and advantages of the present invention will become readily apparent by reference to the following detailed description when considered in conjunction with the accompanying drawings wherein.

DETAILED DESCRIPTION OF THE INVENTION

Reference will now be made in detail to the exemplary embodiments of the present invention, examples of which are illustrated in the accompanying drawings. However, the present invention is not limited to the exemplary embodiments illustrated hereinafter, and the exemplary embodiments herein are rather introduced to provide easy and complete understanding of the scope and spirit of the present invention. Therefore, the present invention should not be construed as being limited to the exemplary embodiments set forth herein. Like reference numerals in the drawings denote like elements.

The terminology used herein is for the purpose of describing particular exemplary embodiments only and is not intended to be limiting of the present invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of manufacturing a single-crystal nitride-based semiconductor substrate by forming a ZnO-based layer, a seed material layer ("SML") and a multifunctional substrate ("MS") on an upper surface of a first substrate ("FS") including sapphire, silicon (Si), zinc oxide ("ZnO") or gallium arsenide ("GaAs"), and a method of manufacturing a high-quality nitride-based optoelectronic device by using the single-crystal nitride-based semiconductor substrate will be described with reference to the accompanying drawings.

Figure 1A:
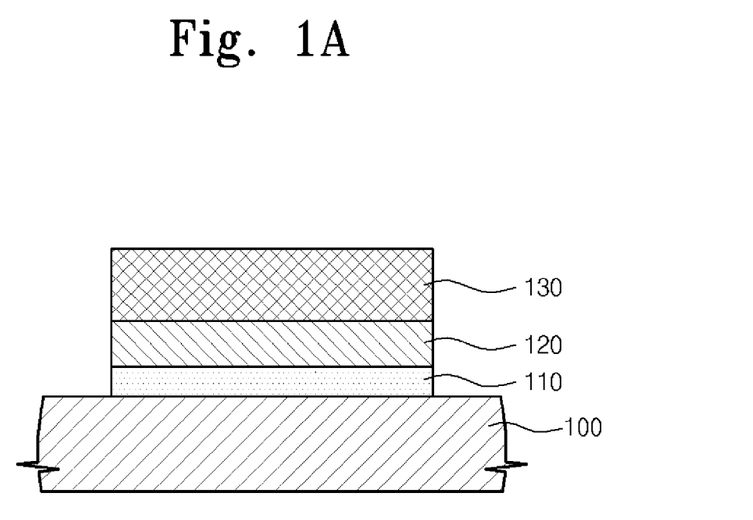
FIGS. 1A and 1B are cross-sectional views showing a seed material layer in the form of a single layer or a bi-layer provided on an upper surface of a first substrate, a multifunctional substrate formed on the seed material layer, and a single-crystal nitride-based layer (or a light emitting structure for a light emitting device) formed on the multifunctional substrate for the purpose of homoepitaxial growth.
Figure 1B:
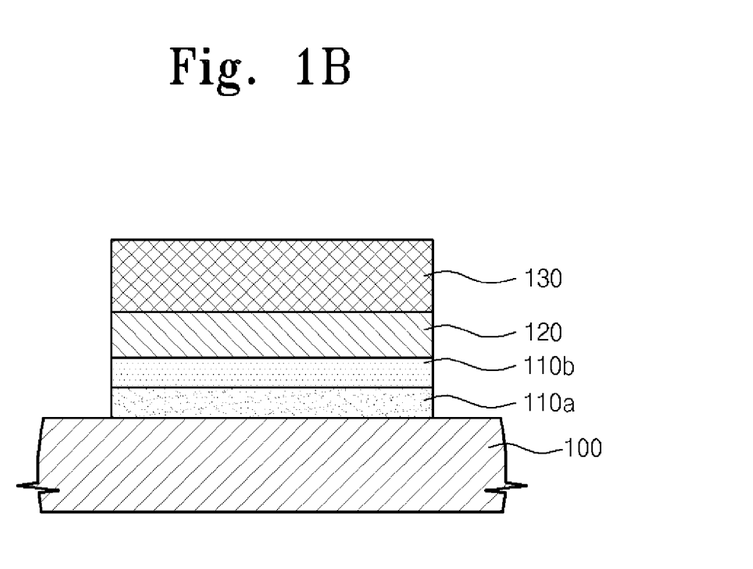

FIGS. 1A and 1B are cross-sectional views showing a seed material layer in the form of a single layer or a bi-layer provided on an upper surface a first substrate, a multifunctional substrate formed on the seed material layer, and a single-crystal nitride-based layer (or a light emitting structure for a light emitting device) formed on the multifunctional substrate for the purpose of homoepitaxial growth.

Referring to FIG. 1A, a seed material layer 110 and a multifunctional substrate 120 are sequentially formed on an upper surface of a first substrate 100 including sapphire, silicon (Si), zinc oxide ("ZnO") or gallium arsenide ("GaAs"). Then, a single-crystal nitride-based layer or a light emitting structure 130 is grown from the upper surface of the multifunctional substrate 120 in a metal organic vapor deposition ("MOCVD") chamber under a hydrogen atmosphere where ammonium ("$NH_3$") and hydrogen ("$H_2$") carrier gas are provided in a high temperature condition of 1000° C. or more.

The multifunctional substrate 120 is a primary element of the present invention and includes at least one selected from the group consisting of aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), and silicon carbon nitride ("Si—C—N"), which has thermal stability and reduction-resistant characteristics under the reduction atmosphere where ammonium ("$NH_3$") and hydrogen ("$H_2$") carrier gas are provided in a high temperature condition of 1000° C. or more.

In exemplary embodiments, the multifunctional substrate 120 including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") is prepared in the form of a single crystal layer or a poly-crystal layer having a hexagonal crystalline structure. However, the present invention is not limited to the above crystal structure.

In exemplary embodiments, oxide or nitride including at least one of silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chrome (Cr), and lanthanum (La) is added to the multifunctional substrate 120 including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") in order to adjust crystallinity and electron concentration and to reduce, as much as possible, dislocation density in the single-crystal nitride-based semiconductor layer formed on the upper surface of the multifunctional substrate 120. Preferably, metal oxide or nitride oxide added to the multifunctional substrate 120 has a nano-phase such that the dislocation density in the single-crystal nitride-based semiconductor layer can be easily adjusted.

In exemplary embodiments, the amount of elements added to the multifunctional substrate 120 is limited within a range of about 0.1 weight percent to about 49 weight percent.

In exemplary embodiments, the multifunctional substrate 120 has a thickness of about 20 micron meters or less.

In exemplary embodiments, the multifunctional substrate 120 including aluminum oxide ("Al—O"), aluminum nitride ("Al—N"), aluminum nitride oxide ("Al—N—O"), gallium nitride ("Ga—N"), boron nitride ("B—N"), silicon carbide ("Si—C"), or silicon carbon nitride ("Si—C—N") is formed through high-temperature/low temperature chemical vapor deposition ("CVD") using chemical reaction and/or physical vapor deposition ("PVD"), wherein the CVD includes metal-organic chemical vapor deposition ("MOCVD") and plasma enhanced chemical vapor deposition ("PECVD"), and the PVD includes thermal or E-beam evaporation, pulsed laser deposition, sputtering deposition employing gas ions, such as oxygen ($O_2$), nitrogen ($N_2$), or argon (Ar), and co-sputtering deposition using at least two sputtering guns.

More preferably, the multifunctional substrate 120 is grown from the upper surface of the seed material layer 110, which is formed on the upper surface of the first substrate 100, within a temperature range between room temperature and 1500° C.

In order to successively grow the multifunctional substrate 120 having superior crystallinity, the seed material layer 110 is primarily formed on the first substrate 100 before the multifunctional substrate 120 is formed on the first substrate 100.

The seed material layer 110 is stacked on the upper surface of the first substrate 100 and allows the multifunctional substrate 120 to have superior crystallinity and a hexagonal crystalline structure.

In exemplary embodiments, the seed material layer 110 includes metal, oxide, nitride, carbide, boride, oxynitride, carbonnitride, or silicide as described below. In addition, the seed material layer 110 is prepared in the form of a single layer or a multi-layer having a thickness of 10 microns or less.

Examples of the metal used for the seed material layer 110 include: at least one material of Ti, Si, W, Co, Ni, Mo, Sc, Mg, Ge, Cu, Be, Zr, Fe, Al, Cr, Nb, Re, Rh, Ru, Hf, Ir, Os, V, Pd, Y, Ta, Tc, La and rare-earth metals.

Examples of the oxide used for the seed material layer 110 include: at least one material of BeO, $CeO_2$, $Cr_2O_3$, $HfO_2$, $La_2O_3$, MgO, $Nb_2O_3$, $SiO_2$, $Ta_2O_5$, $ThO_2$, $TiO_2$, $Y_2O_3$, $ZrO_2$ and $ZrSiO_2$, Examples of the nitride used for the seed material layer 110 include: at least one material of AlN, GaN, InN, BN, $Be_3N_2$, $Cr_2N$, HfN, MoN, NbN, $Si_3N_4$, TaN, $Ta_2N$, $Th_2N_2$, TiN, $WN_2$, $W_2N$, VN and ZrN.

Examples of the carbide used for the seed material layer 110 include: at least one material of $B_4C$, $Cr_2$, HfC, $LaC_2$, $Mo_2C$, $Nb_2C$, SiC, $Ta_2C$, $ThC_2$, TiC, $W_2C$, WC, $V_2C$ and ZrC, Examples of the boride used for the seed material layer 110 include: at least one material of $AlB_2$, $BeB_2$, $CrB_2$, $HfB_2$, $LaB_2$, $MoB_2$, MoB, $NbB_4$, $SiB_6$, $TaB_2$, $ThB_4$, $TiB_2$, WB, $VB_2$ and $ZrB_2$.

Examples of the oxynitride used for the seed material layer 110 include at least one material of AlON and SiON.

Examples of the carbonnitride used for the seed material layer 110 include SiCN, Examples of the silicide used for the seed material layer 110 include: at least one material of $CrSi_2$, $Cr_2Si$, $HfSi_2$, $MoSi_2$, $NbSi_2$, $TaSi_2$, $Ta_5Si_3$, $ThSi_2$, $Ti_5Si_3$, $WSi_2$, $W_5Si_3$, $V_3Si$ and $ZrSi_2$.

In exemplary embodiments, the seed material layer 110 is formed through high-temperature/low temperature chemical vapor deposition ("CVD") using chemical reaction and/or physical vapor deposition ("PVD"), wherein the CVD includes metal-organic chemical vapor deposition ("MOCVD") and plasma enhanced chemical vapor deposition ("PECVD"). The PVD includes thermal or E-beam evaporation, pulsed laser deposition, sputtering deposition employing gas ions, such as oxygen ($O_2$), nitrogen ($N_2$), or argon (Ar), and co-sputtering deposition using at least two sputtering guns.

More preferably, the seed material layer 110 is deposited on the upper surface of the first substrate 100 within a temperature range between room temperature and 1500° C.

According to another exemplary embodiment of the present invention, instead of a single seed material layer 110 shown in FIG. 1A, first and second seed material layers 110a and 110b are formed on the first substrate 100 including sapphire, silicon (Si), zinc oxide ("ZnO") or gallium arsenide ("GaAs"). In this case, the multifunctional substrate 120 is grown from the upper surface of the second seed material layer 110b and the single-crystal nitride-based layer or the light emitting structure 130 is stacked on the multifunctional substrate 120.

If the seed material layer is prepared in the form of a bi-layer structure as shown in FIG. 1B, the quality of the multifunctional substrate 120 can be improved, thus improving the quality of the single-crystal nitride-based layer or the light emitting structure 130.

In exemplary embodiments, the first seed material layer 110a includes a material different from that of the second seed material layer 110b.

Figure 2A:
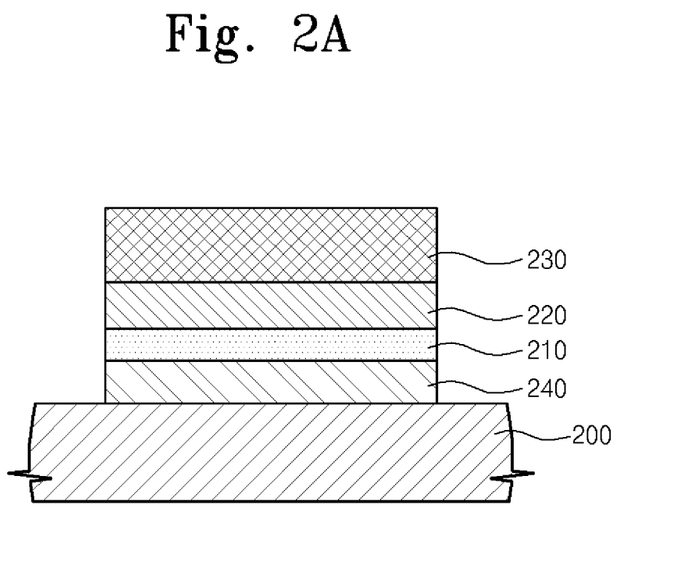
FIGS. 2A and 2B are cross-sectional views showing a ZnO-based layer formed on a first substrate, a seed material layer in the form of a single layer or a bi-layer provided on an upper surface the ZnO-based layer, a multifunctional substrate formed on the seed material layer, and a single-crystal nitride-based layer (or a light emitting structure for a light emitting device) formed on the multifunctional substrate for the purpose of homoepitaxial growth.
Figure 2B:
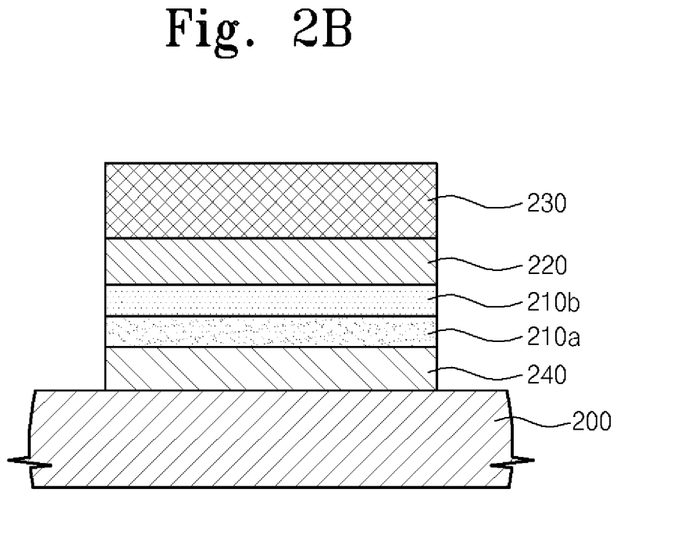

FIGS. 2A and 2B are cross-sectional views showing a ZnO-based layer 240 formed on a first substrate 200, a seed material layer 210 in the form of a single layer (FIG. 2A) or a bi-layer (FIG. 2B) provided on the upper surface the ZnO-based layer 240, a multifunctional substrate 220 formed on the seed material layer 210, and a single-crystal nitride-based layer 230 (or a light emitting structure for a light emitting device) formed on the multifunctional substrate 220 for the purpose of homoepitaxial growth.

Referring to FIGS. 2A and 2B, after growing the single-crystal nitride-based layer or the light emitting structure 230 by using the seed material layer 210 in the form of a single layer or a bi-layer and the multifunctional substrate 220, the ZnO-based layer 240, which is easily dissolved by means of acid and base solution, is formed on the upper surface of the first substrate 200 before the seed material layer 210 is deposited on the upper surface of the first substrate 200 in such a manner that the thick first substrate 200 can be readily removed through wet etching or dry etching without causing any etching damage to the single-crystal nitride-based layer or the light emitting structure 230.

At least one of silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chrome (Cr), and lanthanum (La) is added to the ZnO-based layer 240.

In exemplary embodiments, the amount of elements added to the ZnO-based layer 240 is limited within a range of about 0.1 weight percent to about 49 weight percent.

In exemplary embodiments, the ZnO-based layer 240 is formed through high-temperature/low temperature chemical vapor deposition ("CVD") using chemical reaction and/or physical vapor deposition ("PVD"), wherein the CVD includes metal-organic chemical vapor deposition ("MOCVD") and plasma enhanced chemical vapor deposition ("PECVD"). The PVD includes thermal or E-beam evaporation, pulsed laser deposition, sputtering deposition employing gas ions, such as oxygen ($O_2$), nitrogen ($N_2$), or argon (Ar), and co-sputtering deposition using at least two sputtering guns.

More preferably, the ZnO-based layer 240 is grown from the upper surface of the first substrate 200 within a temperature range between room temperature and 1500° C.

Figure 3:
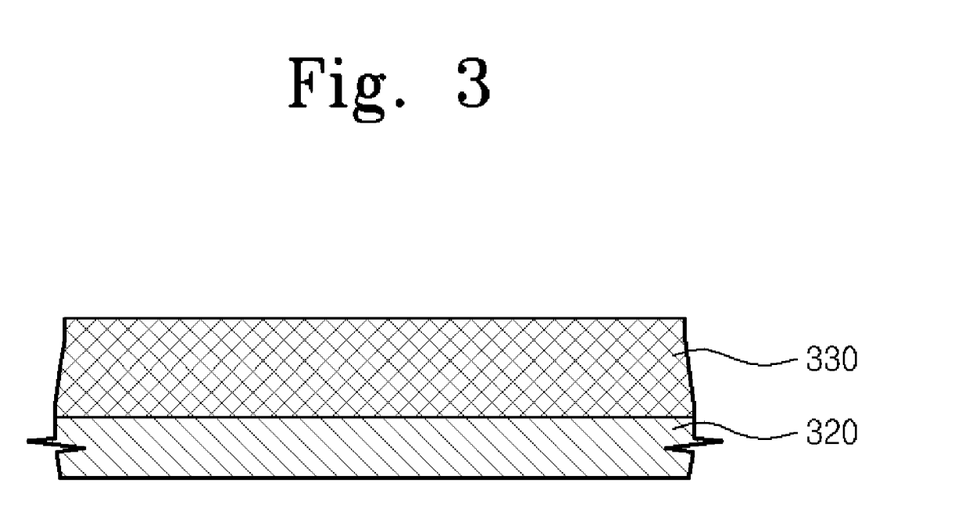
FIG. 3 is a cross-sectional view showing a stacked structure in which a ZnO-based layer and the seed material layer have been removed.

FIG. 3 is a cross-sectional view showing a stacked structure in which the ZnO-based layer and the seed material layer have been removed.

Referring to FIG. 3, the thick first substrate 100 or 200, the ZnO-based layer 240, and the seed material layer 110 or 210 are completely removed from the stack structure shown in FIGS. 1 and 2 through performing wet etching by using acid solution or base solution or performing dry etching by using gas ions, such as hydrogen ions. The single-crystal nitride-based layer or the light emitting structure 330 for the light emitting device is stacked on the upper surface of the multifunctional substrate 320 for the purpose of homoepitaxial growth.

In exemplary embodiments, in order to improve crystallinity or electrical characteristics of the single-crystal nitride-based layer or the light emitting structure 330 stacked on the upper surface of the multifunctional substrate 320 for the purpose of homoepitaxial growth, a heat-treatment process is performed within a temperature range between room temperature and 1500° C. under oxygen ($O_2$), nitrogen ($N_2$), hydrogen ($H_2$), argon (Ar), vacuum or air atmosphere.

Figure 4A:
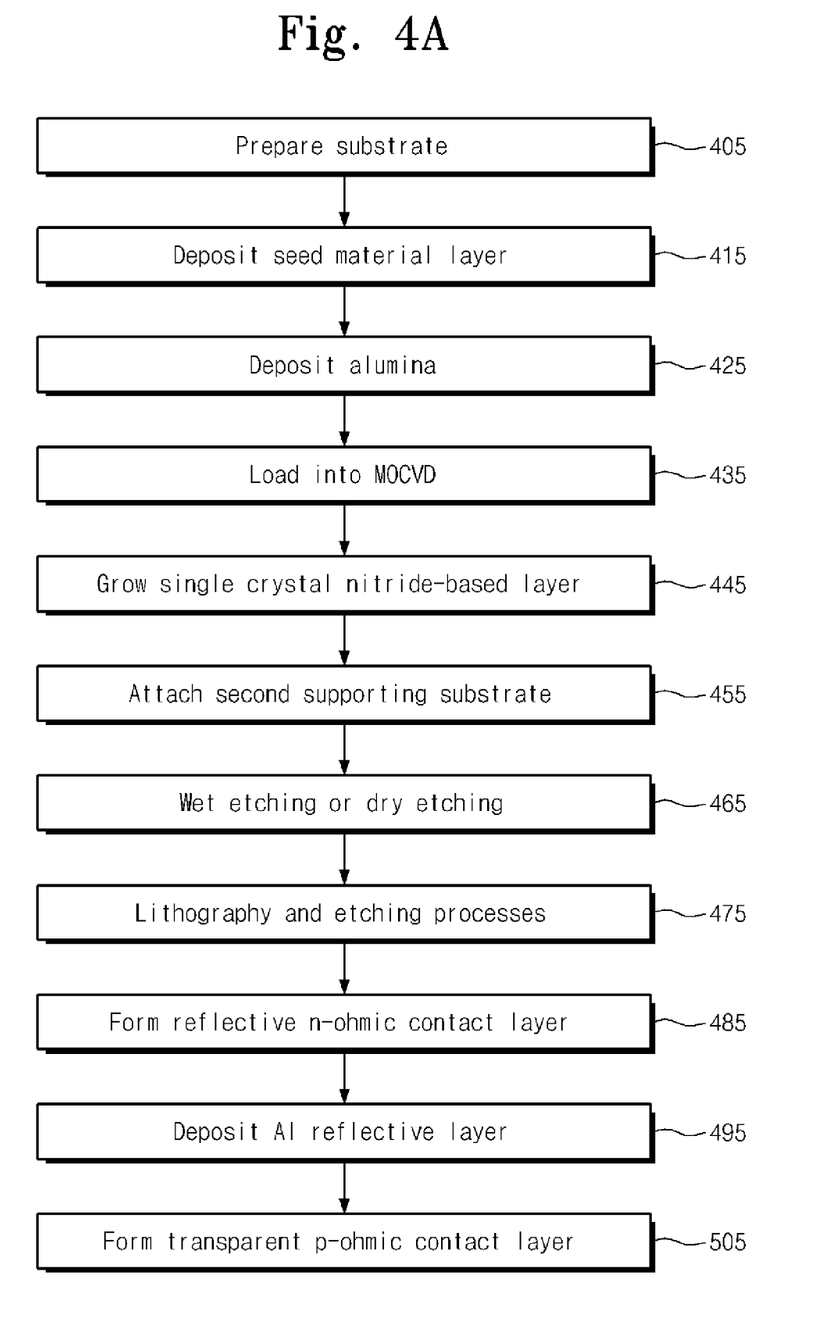
FIGS. 4A and 4B are a flowchart and a cross-sectional view showing a vertical top emission type nitride-based light emitting device fabricated by using a ZnO-based layer, a seed material layer and a multifunctional substrate according to an exemplary embodiment of the present invention.
Figure 4B:
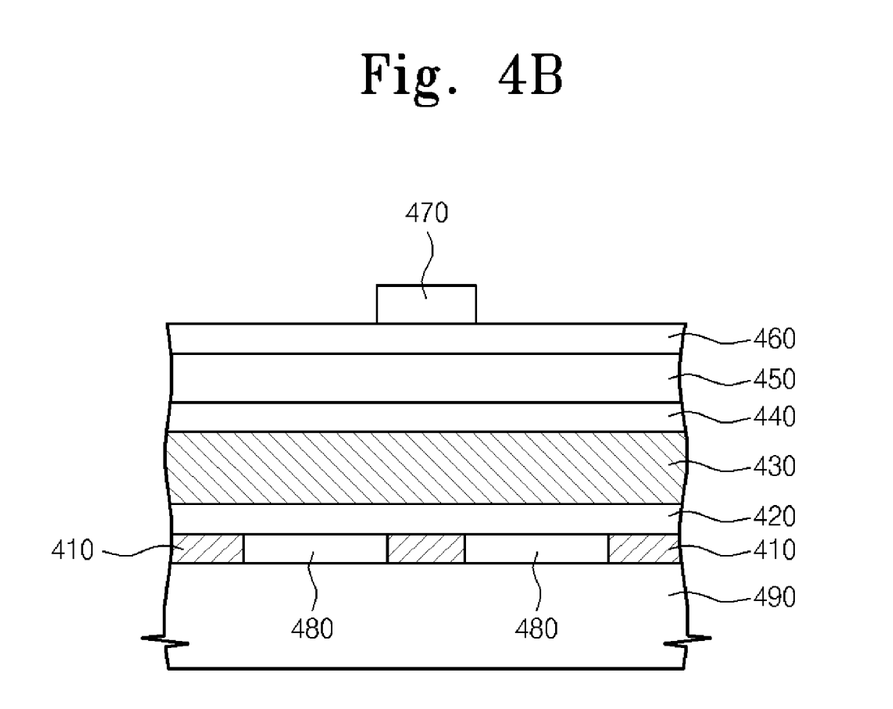

FIG. 4A is a flowchart showing the procedure of manufacturing a vertical top emission type nitride-based light emitting device. FIG. 4B is a cross-sectional view showing the vertical top emission type nitride-based light emitting device including a ZnO-based layer, a seed material layer, and a multifunctional substrate according to an exemplary embodiment of the present invention.

Referring to FIGS. 4A and 4B, similar to FIGS. 3A and 3B, a nitride-based buffer layer 420 and a nitride-based light emitting structure, which includes an n-nitride-based cladding layer 430, a nitride-based active layer 440 and a p-nitride-based cladding layer 450, are sequentially formed on the upper surface of a multifunctional substrate 410 at blocks 405, 415, 425, 435 and 445. A second supporting substrate is attached to an upper portion of a p-nitride-based semiconductor layer so as to prevent the light emitting structure from being dissolved during the manufacturing process for the nitride-based light emitting device at block 455. Then, lithography and etching processes are performed so as to form patterns having various sizes and intervals in the multifunctional substrate 410 at blocks 465 and 475. In this state, a reflective n-ohmic contact layer 480 is formed in the multifunctional substrate 410 at block 485 and a metallic reflector 490 is deposited on the bottom surface of the multifunctional substrate 410 at block 495. Thereafter, the second supporting substrate attached to the upper portion of the p-nitride-based semiconductor is removed and a transparent p-ohmic contact layer 460 is formed on the p-nitride-based cladding layer 450 at block 505, thereby obtaining the vertical top emission type nitride-based light emitting device.

The procedure of manufacturing the high-quality light emitting device by using the single-crystal nitride-based semiconductor substrate according to the present invention may not be limited to the procedure shown in FIG. 4A. In other words, the procedure shown in FIG. 4A can be modified in combination with technologies suitable to fabricate the highly reliable light emitting device used as a next-generation white light source.

According to another exemplary embodiment of the present invention, the seed material layer including chrome oxide ("$Cr_2O_3$") is deposited on the upper surface of the first substrate including sapphire, silicon (Si), silicon germanium ("SiGe"), zinc oxide ("ZnO") or gallium arsenide ("GaAs"), and the multifunctional substrate 410 including single-crystal aluminum oxide ($Al_2O_3$) is grown from the upper surface of the seed material layer. In this state, the nitride-based buffer layer 420 and the single-crystal nitride-based light emitting structure, which includes the n-nitride-based cladding layer 430, the nitride-based active layer 440 and the p-nitride-based cladding layer 450, are sequentially stacked on the multifunctional substrate, thereby obtaining the vertical top emission type nitride-based light emitting device according to the present invention.

In general, each of the nitride-based buffer layer 420, the n-nitride-based cladding layer 430, the nitride-based active layer 440 and the p-nitride-based cladding layer 450 basically include a compound selected from Group III nitride-based compounds expressed as AlxInyGazN (where x, y and z are integers). In addition, dopant is added to the n-nitride-based cladding layer 430 and the p-nitride-based cladding layer 450.

The nitride-based active layer 440 can be prepared in the form of a single layer or a multiple quantum well ("MQW"), that is, a bi-layer such as an AlxInyGazN/AlxInyGazN layer (where x, y and z are integers).

If a GaN-based compound is used to fabricate the nitride-based light emitting device, the nitride-based buffer layer 420 is formed by using GaN, the n-nitride-based cladding layer 430 is formed by adding n-dopant, such as silicon (Si), germanium (Ge), selenium (Se) or tellurium (Te), to GaN, the nitride-based active layer 440 is prepared in the form of InGaN/GaN MQW or AlGaN/GaN MQW. The p-nitride-based cladding layer 450 is formed by adding p-dopant, such as magnesium (Mg), zinc (Zn), calcium (Ca), strontium (St) or barium (Ba), to GaN.

The reflective n-ohmic contact layer 480 is interposed between the n-nitride-based cladding layer 430 and the metallic reflector 490. The reflective n-ohmic contact layer 480 may have various structures generally known in the art, such as an aluminum/titanium (Al/Ti) layer having a large thickness. In exemplary embodiments, the metallic reflector 490 includes a thick reflective metal, such as aluminum (Al), silver (Ag) or rhodium (Rh).

The transparent p-ohmic contact layer 460 includes electrode materials used to form a p-ohmic contact. The electrode materials include oxidized nickel-gold ("Ni—Au"), oxidized silver (Ag), transparent conducting oxides, which are oxide compounds based on indium tin oxide ("ITO"), zinc oxide ("ZnO"), tin oxide ("$SnO_2$"), or indium oxide ("$In_2O_3$"), and conducting transitional metal nitrides including tin nitrides ("TiN"). In addition, a p-electrode pad 470 has a stacked layer structure, such as a nickel/gold ("Ni/Au") layer or a silver/gold (Ag/Au) layer.

The above layers can be formed through conventional deposition methods, such as E-beam evaporation, physical vapor deposition ("PVD"), chemical vapor deposition ("CVD"), plasma laser deposition ("PLD"), dual-type thermal evaporation, or sputtering.

Figure 5A:
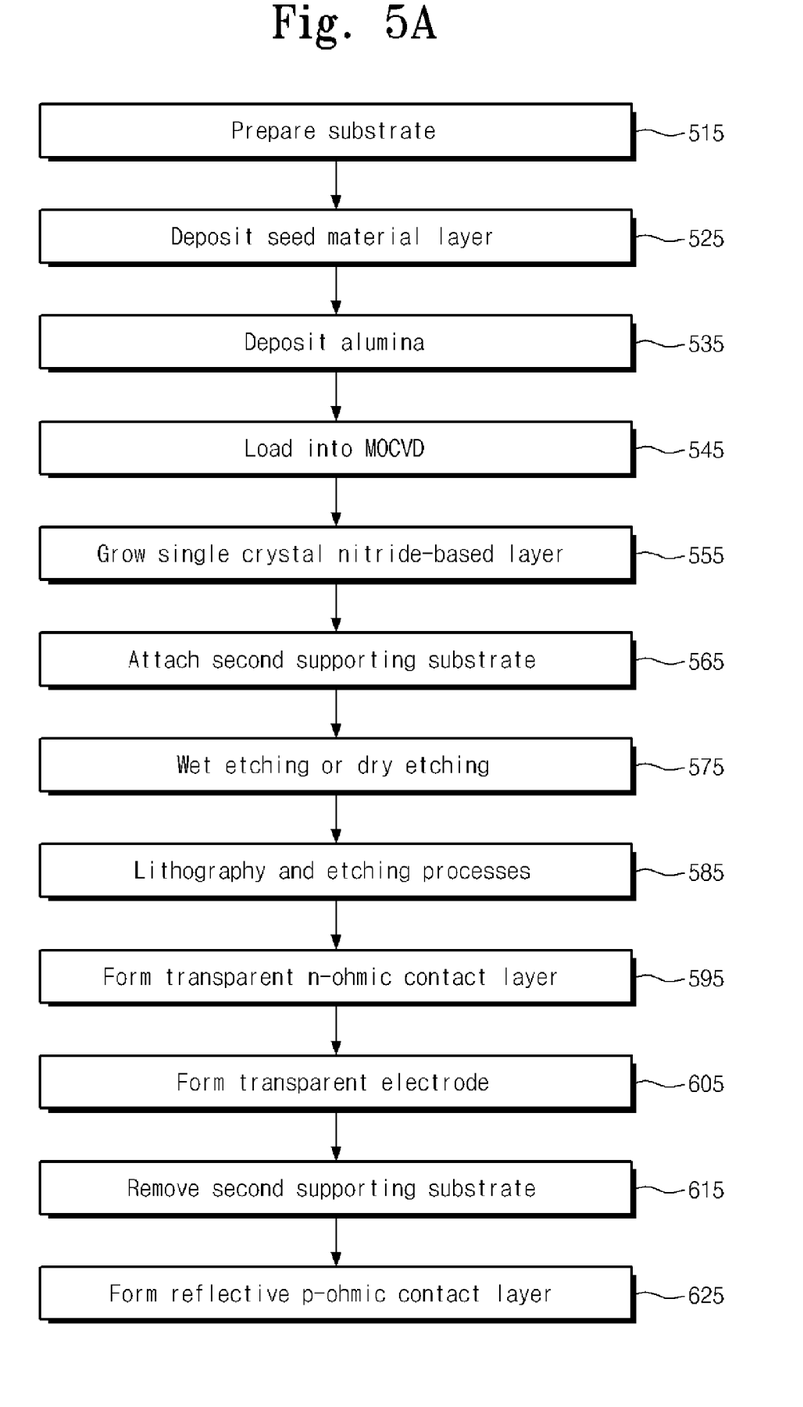
FIGS. 5A and 5B are a flowchart and a cross-sectional view showing a vertical flip chip type nitride-based light emitting device fabricated by using a ZnO-based layer, a seed material layer and a multifunctional substrate according to another exemplary embodiment of the present invention.
Figure 5B:
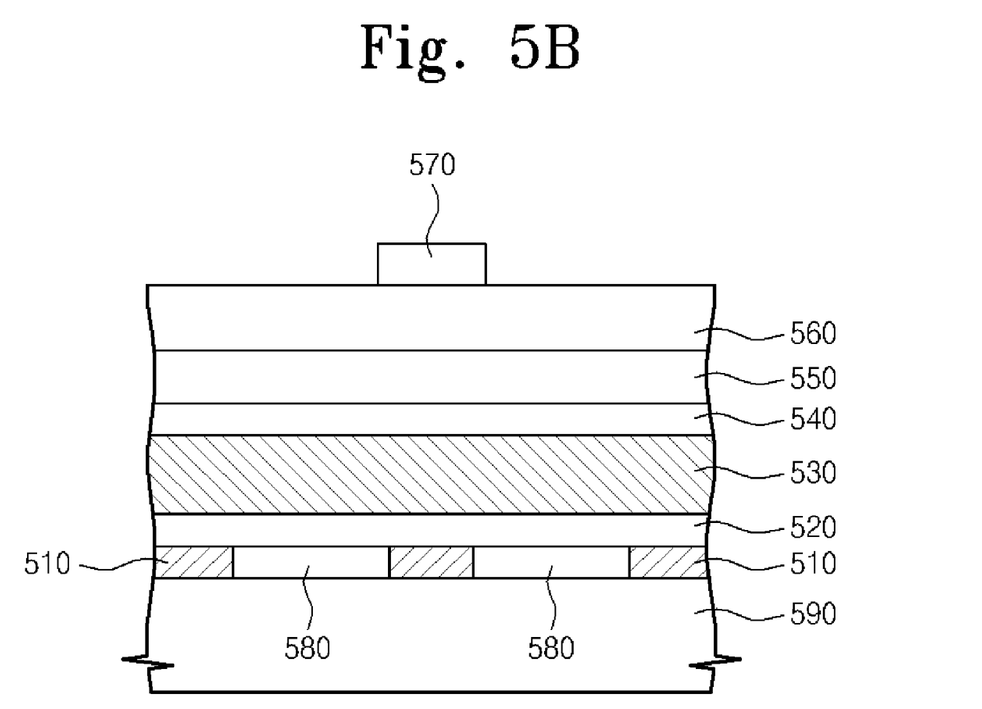

FIG. 5A is a flowchart showing a procedure of manufacturing a vertical flip chip type nitride-based light emitting device. FIG. 5B is a cross-sectional view showing the vertical flip chip type nitride-based light emitting device including a ZnO-based layer, a seed material layer and a multifunctional substrate according to an exemplary embodiment of the present invention.

Referring to FIGS. 5A and 5B, similar to FIGS. 3A and 3B, a nitride-based buffer layer 520 and a nitride-based light emitting structure, which includes an n-nitride-based cladding layer 530, a nitride-based active layer 540 and a p-nitride-based cladding layer 550, are sequentially formed on the upper surface of a multifunctional substrate 510 at blocks 515, 525, 535, 545 and 555. After that, a second supporting substrate is attached to an upper portion of a p-nitride-based semiconductor layer so as to prevent the light emitting structure from being dissolved during the manufacturing process for the nitride-based light emitting device at block 565. Then, lithography and etching processes are performed so as to form patterns having various sizes and intervals in the multifunctional substrate 510 at blocks 575 and 585. In this state, a transparent n-ohmic contact layer 580 is formed in the multifunctional substrate 510 at block 595 and a transparent conducting layer 490 is deposited on the bottom surface of the multifunctional substrate 510 at block 605. Thereafter, the second supporting substrate attached to the upper portion of the p-nitride-based semiconductor is removed at block 615 and a reflective p-ohmic contact layer 560 is formed on the p-nitride-based cladding layer 550 at block 625, thereby obtaining the vertical flip chip type nitride-based light emitting device.

The procedure of manufacturing the high-quality light emitting device by using the single-crystal nitride-based semiconductor substrate according to the present invention may not be limited to the procedure shown in FIG. 5A. In other words, the procedure shown in FIG. 5A can be modified in combination with technologies suitable to fabricate the highly reliable light emitting device used as a next-generation white light source.

According to an exemplary embodiment of the present invention, the seed material layer including zinc oxide ("ZnO") or molybdenum (Mo) is deposited on the upper surface of the first substrate including sapphire, silicon (Si), silicon germanium ("SiGe"), zinc oxide ("ZnO") or gallium arsenide ("GaAs"), and the multifunctional substrate including single-crystal aluminum oxide ("$Al_2O_3$") is grown from the upper surface of the seed material layer. In this state, the nitride-based buffer layer 520 and the single-crystal nitride-based light emitting structure, which includes the n-nitride-based cladding layer 430, the nitride-based active layer 440 and the p-nitride-based cladding layer 450, are sequentially stacked on the multifunctional substrate, thereby obtaining the vertical flip chip type nitride-based light emitting device according to the present invention.

In general, each of the nitride-based buffer layer 520, the n-nitride-based cladding layer 530, the nitride-based active layer 540 and the p-nitride-based cladding layer 550 basically include a compound selected from Group III nitride-based compounds expressed as AlxInyGazN (where x, y and z are integers). In addition, dopant is added to the n-nitride-based cladding layer 530 and the p-nitride-based cladding layer 550.

The nitride-based active layer 540 can be prepared in the form of a single layer or a multiple quantum well, that is, a bi-layer such as an AlxInyGazN/AlxInyGazN layer (where x, y and z are integers).

If a GaN-based compound is used to fabricate the nitride-based light emitting device, the nitride-based buffer layer 520 is formed by using GaN, the n-nitride-based cladding layer 530 is formed by adding n-dopant, such as silicon (Si), germanium (Ge), selenium (Se) or tellurium (Te), to GaN, the nitride-based active layer 540 is prepared in the form of InGaN/GaN MQW or AlGaN/GaN MQW. The p-nitride-based cladding layer 550 is formed by adding p-dopant, such as magnesium (Mg), zinc (Zn), calcium (Ca), strontium (St) or barium (Ba), to GaN.

The transparent n-ohmic contact layer 580 is interposed between the n-nitride-based cladding layer 530 and the transparent conducting layer 590. The transparent n-ohmic contact layer 580 includes electrode materials used to form a p-ohmic contact. The electrode materials include transparent conducting oxides, which are oxide compounds based on indium tin oxide ("ITO"), zinc oxide ("ZnO"), tin oxide ("$SnO_2$"), or indium oxide ("$In_2O_3$"), and conducting transitional metal nitrides including tin nitrides ("TiN"). In addition, the transparent conducting layer 590 is formed by using conducting transitional metal nitrides including tin nitrides ("TiN") or transparent conducting oxides, which are oxide compounds based on indium tin oxide ("ITO"), zinc oxide ("ZnO"), tin oxide ("$SnO_2$"), or indium oxide ("$In_2O_3$").

The reflective p-ohmic contact layer 560 includes electrode materials used to form a reflective p-ohmic contact, such as aluminum (Al), silver (Ag) or rhodium (Rh), which is generally known in the art. In addition, a p-electrode pad 570 has a stacked layer structure, such as a nickel/gold ("Ni/Au") layer or a silver/gold ("Ag/Au") layer.

The above layers can be formed through conventional deposition methods, such as E-beam evaporation, physical vapor deposition ("PVD"), chemical vapor deposition ("CVD"), plasma laser deposition ("PLD"), dual-type thermal evaporation, or sputtering.

Figure 6A:
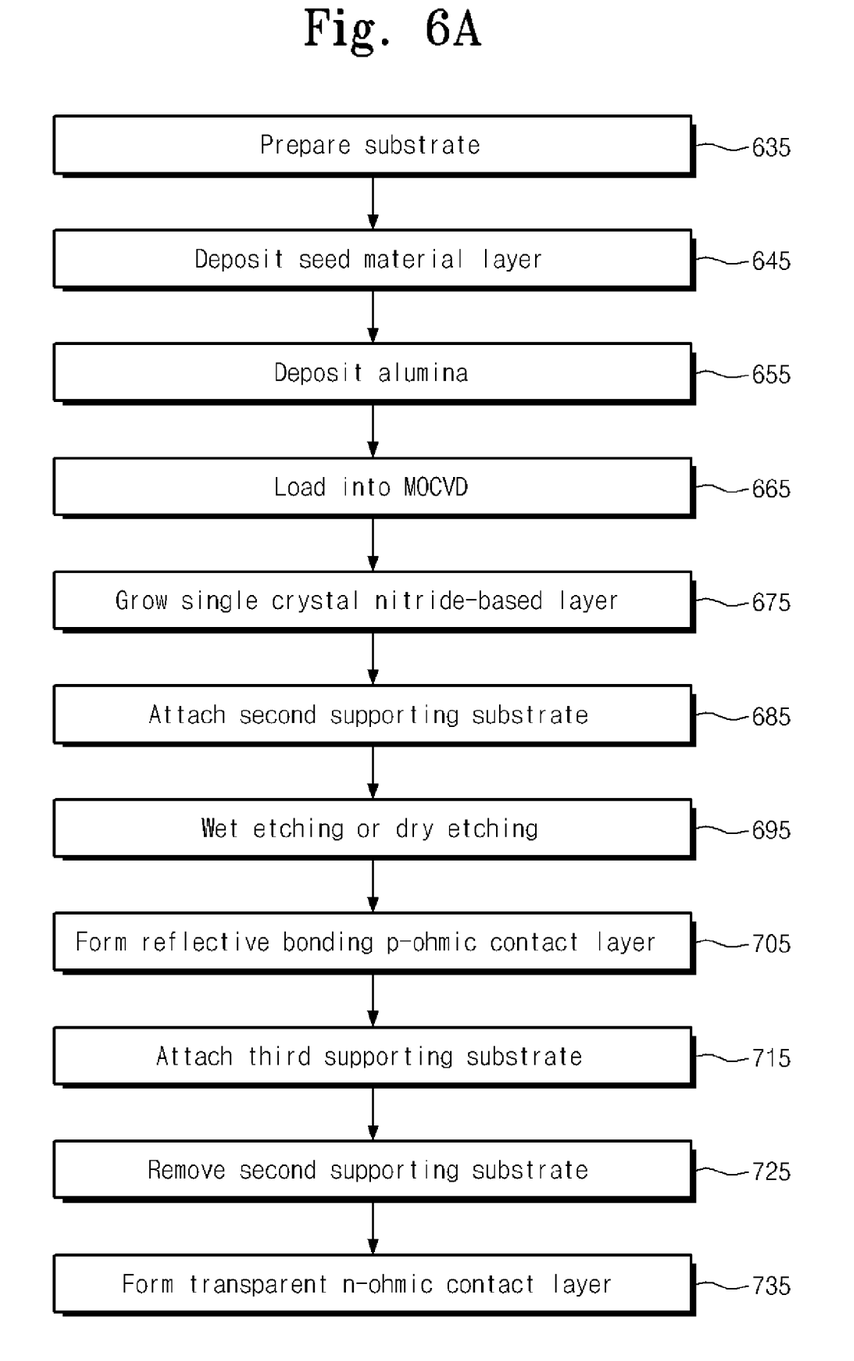
FIGS. 6A and 6B are a flowchart and a cross-sectional view showing a vertical top emission type nitride-based light emitting device fabricated by using a ZnO-based layer, a seed material layer and a multifunctional substrate according to yet another exemplary embodiment of the present invention.
Figure 6B:
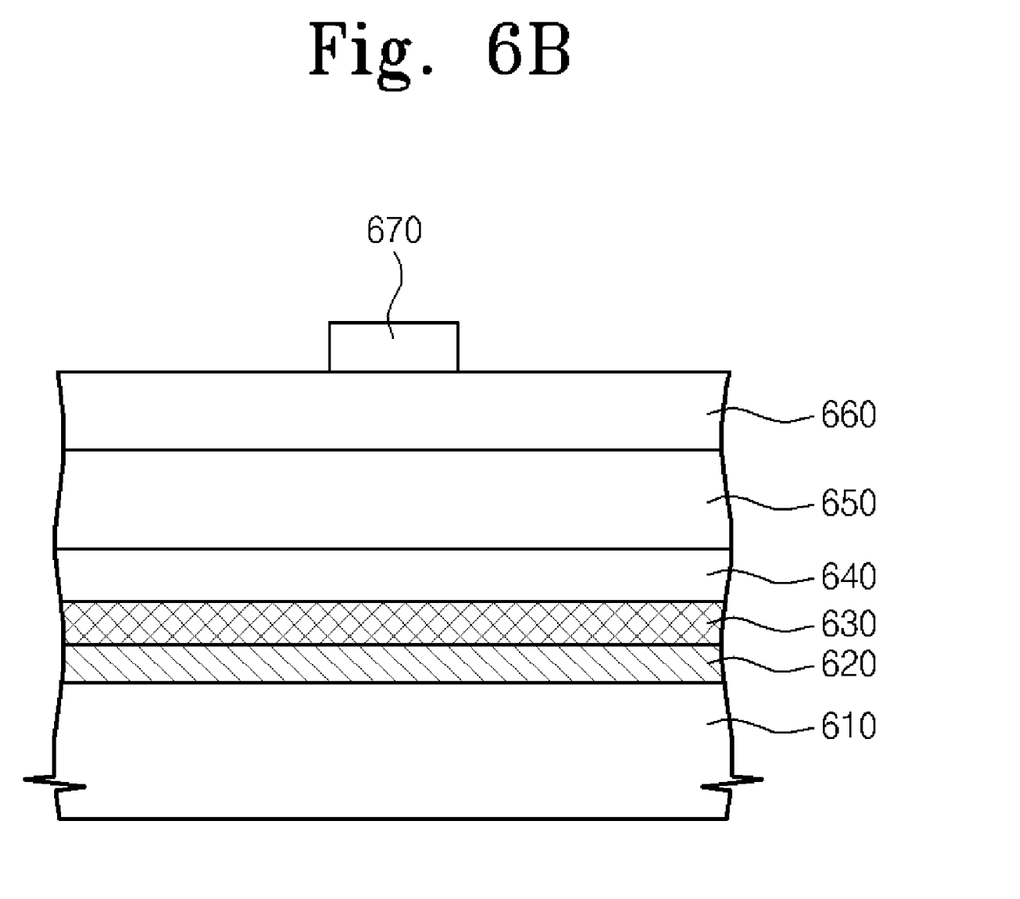

FIG. 6A is a flowchart showing a procedure of manufacturing a vertical top emission type nitride-based light emitting device. FIG. 6B is a cross-sectional view showing the vertical top emission type nitride-based light emitting device including a ZnO-based layer, a seed material layer and a multifunctional substrate according to another exemplary embodiment of the present invention.

Referring to FIGS. 6A and 6B, similar to FIGS. 3A and 3B, a nitride-based buffer layer and a nitride-based light emitting structure, which includes an n-nitride-based cladding layer 650, a nitride-based active layer 640 and a p-nitride-based cladding layer 630, are sequentially formed on the upper surface of a multifunctional substrate at blocks 635, 645, 655, 665 and 675. After that, a second supporting substrate is attached to an upper portion of a p-nitride-based semiconductor layer at block 685 to prevent the light emitting structure from being dissolved during the manufacturing process for the nitride-based light emitting device. Then, the multifunctional substrate is completely removed through the wet etching process or the dry etching process at blocks 695 and 705, and a reflective bonding p-ohmic contact layer 620 (e.g., third supporting substrate) is bonded to a first supporting substrate 610 by means of a bonding material at block 715. Thereafter, the second supporting substrate attached to the upper portion of the p-nitride-based semiconductor is removed at block 725 and a transparent n-ohmic contact layer 660 is formed on the n-nitride-based cladding layer 650 at block 735, thereby obtaining the vertical top emission type nitride-based light emitting device.

The procedure of manufacturing the high-quality light emitting device by using the single-crystal nitride-based semiconductor substrate according to the present invention may not be limited to the procedure shown in FIG. 6A. In other words, the procedure shown in FIG. 6A can be modified in combination with technologies suitable to fabricate the highly reliable light emitting device used as a next-generation white light source.

According to the exemplary embodiment of the present invention, the seed material layer including zinc oxide ("ZnO") or titanium (Ti) is deposited on the upper surface of the first substrate including sapphire, silicon (Si), silicon germanium ("SiGe"), zinc oxide ("ZnO") or gallium arsenide ("GaAs"), and the multifunctional substrate including single-crystal aluminum oxide ("$Al_2O_3$") is grown from the upper surface of the seed material layer. In this state, the nitride-based buffer layer and the single-crystal nitride-based light emitting structure, which includes the n-nitride-based cladding layer 650, the nitride-based active layer 640 and the p-nitride-based cladding layer 630, are sequentially stacked on the multifunctional substrate 620, thereby obtaining the vertical top emission type nitride-based light emitting device according to the present invention.

In general, each of the nitride-based buffer layer, the n-nitride-based cladding layer 650, the nitride-based active layer 640 and the p-nitride-based cladding layer 630 basically include a compound selected from Group III nitride-based compounds expressed as AlxInyGazN (where x, y and z are integers). In addition, dopant is added to the n-nitride-based cladding layer 650 and the p-nitride-based cladding layer 630.

The nitride-based active layer 640 can be prepared in the form of a single layer or a multiple quantum well, that is, a bi-layer such as an AlxInyGazN/AlxInyGazN layer (where x, y and z are integers).

If a GaN-based compound is used to fabricate the nitride-based light emitting device, the nitride-based buffer layer is formed by using GaN, the n-nitride-based cladding layer 650 is formed by adding n-dopant, such as silicon (Si), germanium (Ge), selenium (Se) or tellurium (Te), to GaN, the nitride-based active layer 640 is prepared in the form of InGaN/GaN MQW or AlGaN/GaN MQW, and the p-nitride-based cladding layer 630 is formed by adding p-dopant, such as magnesium (Mg), zinc (Zn), calcium (Ca), strontium (St) or barium (Ba), to GaN.

The transparent n-ohmic contact layer 660 is interposed between the n-nitride-based cladding layer 650 and a reflective n-electrode pad 670. The transparent n-ohmic contact layer 660 includes electrode materials used to form a p-ohmic contact. The electrode materials include transparent conducting oxides, which are oxide compounds based on indium tin oxide ("ITO"), zinc oxide ("ZnO"), tin oxide ("SnO$_2$"), or indium oxide ("In$_2$O$_3$"), and conducting transitional metal nitrides including tin nitrides ("TiN"). In addition, the reflective n-electrode pad 670 has a stacked layer structure, such as a nickel/gold ("Ni/Au") layer or a silver/gold ("Ag/Au") layer. The reflective bonding p-ohmic contact layer 620 can be formed with various structures having a large thickness by using a solid solution or a reflective metal, such as silver (Ag) or rhodium (Rh).

The above layers can be formed through conventional deposition methods, such as E-beam evaporation, physical vapor deposition ("PVD"), chemical vapor deposition ("CVD"), plasma laser deposition ("PLD"), dual-type thermal evaporation, or sputtering.

As described above, the present invention provides a single-crystal nitride-based semiconductor substrate and a method of manufacturing a vertical type nitride-based light emitting device by using the same. According to the present invention, a single-crystal nitride-based semiconductor substrate or a light emitting structure for homoepitaxial growth can be formed under high temperature and hydrogen atmosphere by using a seed material layer and a multifunctional substrate, which are sequentially formed on an upper surface of a first substrate so as to prevent mechanical and thermal strain and decomposition from occurring at the upper surface of the first substrate including sapphire, silicon (Si), zinc oxide ("ZnO") or gallium arsenide ("GaAs"). Thus, the present invention provides a high-quality nitride-based light emitting device representing superior light efficiency and heat dissipation while being operated at a low operational voltage.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of growing a single-crystal nitride-based semiconductor substrate, the method comprising:
   depositing a seed material layer on an upper surface of a first substrate;
   growing a multifunctional substrate from an upper surface of the seed material layer;
   heat-treating the seed material layer and the multifunctional substrate;
   forming a multi-layer on an upper surface of the multifunctional substrate, in which the multi-layer comprises a nitride-based buffer layer and a single-crystal nitride-based layer stacked on the nitride-based buffer layer;
   removing the seed material layer and the first substrate by performing wet etching or dry etching; and
   performing a heat-treatment process in order to enhance crystallinity of the multifunction substrate and the single-crystal nitride-based layer obtained through the above steps.

2. The method of claim 1, wherein the seed material layer comprises at least one of metal, oxide, nitride, carbide, boride, oxynitride, carbonnitride, and silicide.

3. The method of claim 2, wherein the metal comprises at least one material selected from the group consisting of Ti, Si, W, Co, Ni, Mo, Sc, Mg, Ge, Cu, Be, Zr, Fe, Al, Cr, Nb, Re, Rh, Ru, Hf, Ir, Os, V, Pd, Y, Ta, Tc, La and rare-earth metals; the oxide comprises at least one material selected from the group consisting of BeO, CeO$_2$, Cr$_2$O$_3$, HfO$_2$, La$_2$O$_3$, MgO, Nb$_2$O$_3$, SiO$_2$, Ta$_2$O$_5$, ThO$_2$, TiO$_2$, Y$_2$O$_3$, ZrO$_2$ and ZrSiO$_2$; the nitride comprises at least one material selected from the group consisting of AlN, GaN, InN, BN, Be$_3$N$_2$, Cr$_2$N, HfN, MoN, NbN, Si$_3$N$_4$, TaN, Ta$_2$N, Th$_2$N$_2$, TiN, WN$_2$, W$_2$N, VN and ZrN; the carbide comprises at least one material selected from the group consisting of B$_4$C, Cr$_2$, HfC, LaC$_2$, Mo$_2$C, Nb$_2$C, SiC, Ta$_2$C, ThC$_2$, TiC, W$_2$C, WC, V$_2$C and ZrC; the boride comprises at least one material selected from the group consisting of AlB$_2$, BeB$_2$, CrB$_2$, HfB$_2$, LaB$_2$, MoB$_2$, MoB, NbB$_4$, SiB$_6$, TaB$_2$, ThB$_4$, TiB$_2$, WB, VB$_2$ and ZrB$_2$; the oxynitride comprises at least one material of AlON and SiON; the carbonnitride comprises at least one material selected from the group consisting of SiCN; and the silicide comprises at least one material selected from the group consisting of CrSi$_2$, Cr$_2$Si, HfSi$_2$, MoSi$_2$, NbSi$_2$, TaSi$_2$, Ta$_5$Si$_3$, ThSi$_2$, Ti$_5$Si$_3$, WSi$_2$, W$_5$Si$_3$, V$_3$Si and ZrSi$_2$.

4. The method of claim 3, wherein the seed material layer has a thickness of about 10 microns or more.

5. The method of claim 4, wherein the seed material layer is in the form of a single layer or multiple layers.

6. The method of claim 5, wherein materials of the multiple layers are different from each other.

7. The method of claim 2, wherein the seed material layer is formed through a chemical vapor deposition or a physical vapor deposition.

8. The method of claim 7, wherein the chemical vapor deposition comprises a metal-organic chemical vapor deposition and plasma enhanced vapor deposition and the physical vapor deposition comprises a thermal or E-beam evaporation, a pulsed laser deposition, a sputtering deposition and co-sputtering deposition using at least two sputtering guns.

9. The method of claim 1, further comprising forming a ZnO-based layer on the upper surface of the first substrate before the seed material layer and the multifunction substrate are formed on the first substrate, wherein the ZnO-based layer is removed in the same step of removing the seed material layer and the first substrate.

10. The method of claim 1, wherein the step of heat-treatment is performed at a temperature of 1500° C. or less under one of oxygen ($O_2$), nitrogen ($N_2$), hydrogen ($H_2$), argon (Ar), and air atmosphere.

11. A method of manufacturing a nitride-based light emitting device, the method comprising:
depositing a seed material layer on an upper surface of a first substrate;
growing a multifunctional substrate from an upper surface of the seed material layer;
heat-treating the seed material layer and the multifunctional substrate;
forming a single-crystal nitride-based light emitting structure on an upper surface of the multifunctional substrate, in which the single-crystal nitride-based light emitting structure comprises a nitride-based buffer layer, an n-nitride-based cladding layer, a nitride-based active layer, and a p-nitride-based cladding layer, which are sequentially stacked on the upper surface of the multifunctional substrate;
removing the seed material layer and the first substrate by performing wet etching or dry etching;
performing a heat-treatment process in order to enhance crystallinity of the multifunction substrate and the single-crystal nitride-based layer;
selectively depositing reflective electrode materials or transparent electrode materials on the single-crystal nitride-based light emitting structure and then performing an ohmic heat-treatment process.

12. The method of claim 11, wherein the seed material layer comprises at least one of metal, oxide, nitride, carbide, boride, oxynitride, carbonnitride, and silicide.

13. The method of claim 12, wherein the metal comprises at least one material selected from the group consisting of Ti, Si, W, Co, Ni, Mo, Sc, Mg, Ge, Cu, Be, Zr, Fe, Al, Cr, Nb, Re, Rh, Ru, Hf, Ir, Os, V, Pd, Y, Ta, Tc, La and rare-earth metals; the oxide comprises at least one material selected from the group consisting of BeO, $CeO_2$, $Cr_2O_3$, $HfO_2$, $La_2O_3$, MgO, $Nb_2O_3$, $SiO_2$, $Ta_2O_5$, $ThO_2$, $TiO_2$, $Y_2O_3$, $ZrO_2$ and $ZrSiO_2$; the nitride comprises at least one material selected from the group consisting of AlN, GaN, InN, BN, $Be_3N_2$, $Cr_2N$, HfN, MoN, NbN, $Si_3N_4$, TaN, $Ta_2N$, $Th_2N_2$, TiN, $WN_2$, $W_2N$, VN and ZrN; the carbide comprises at least one material selected from the group consisting of $B_4C$, $Cr_2$, HfC, $LaC_2$, $Mo_2C$, $Nb_2C$, SiC, $Ta_2C$, $ThC_2$, TiC, $W_2C$, WC, $V_2C$ and ZrC; the boride comprises at least one material selected from the group consisting of $AlB_2$, $BeB_2$, $CrB_2$, $HfB_2$, $LaB_2$, $MoB_2$, MoB, $NbB_4$, $SiB_6$, $TaB_2$, $ThB_4$, $TiB_2$, WB, $VB_2$ and $ZrB_2$; the oxynitride comprises at least one material of AlON and SiON; the carbonnitride comprises at least one material selected from the group consisting of SiCN; and the silicide comprises at least one material selected from the group consisting of $CrSi_2$, $Cr_2Si$, $HfSi_2$, $MoSi_2$, $NbSi_2$, $TaSi_2$, $Ta_5Si_3$, $ThSi_2$, $Ti_5Si_3$, $WSi_2$, $W_5Si_3$, $V_3Si$ and $ZrSi_2$.

14. The method of claim 13, wherein the seed material layer has a thickness of about 10 microns or more.

15. The method of claim 14, wherein the seed material layer is in the form of a single layer or multiple layers.

16. The method of claim 15, wherein materials of the multiple layers are different from each other.

17. The method of claim 12, wherein the seed material layer is formed through a chemical vapor deposition or a physical vapor deposition.

18. The method of claim 17, wherein the chemical vapor deposition comprises a metal-organic chemical vapor deposition and plasma enhanced vapor deposition and the physical vapor deposition comprises a thermal or E-beam evaporation, a pulsed laser deposition, a sputtering deposition and co-sputtering deposition using at least two sputtering guns.

19. The method of claim 11, further comprising the ZnO-based layer is formed on the upper surface of the first substrate before the seed material layer and the multifunction substrate are formed on the first substrate, wherein the ZnO-based layer is removed in the same step of removing the seed material layer and the first substrate.

20. The method of claim 11, wherein heat-treatment is performed at a temperature of 1500° C. or less under one of oxygen ($O_2$), nitrogen ($N_2$), hydrogen ($H_2$), argon (Ar), and air atmosphere.

* * * * *